(12) United States Patent
Kim (10) Patent No.: US 6,567,939 B1
(45) Date of Patent: May 20, 2003

(54) MERGED DATA LINE TEST CIRCUIT FOR CLASSIFYING AND TESTING A PLURALITY OF DATA LINES, AND TEST METHOD PERFORMED BY THE SAME

(75) Inventor: Chul-soo Kim, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/507,764

(22) Filed: Feb. 18, 2000

(30) Foreign Application Priority Data

Jun. 2, 1999 (KR) ............................................. 99-20184

(51) Int. Cl.[7] ............................................. G11C 29/00
(52) U.S. Cl. ...................................... 714/718; 365/201
(58) Field of Search ................................ 714/718–719; 365/201, 189.07

(56) References Cited

U.S. PATENT DOCUMENTS 5,077,689 A  12/1991  Ahn ............................ 365/201
5,311,473 A  * 5/1994  McClure et al. ............ 365/201

OTHER PUBLICATIONS

Mori et al., A 45ns 64 mb DRAM with Merged Match–line Test Architecture, IEEE, p. 110–113, 1991.*
Matsuda et al., A New Array architecture for PArallel Testing in VLSI Memories, IEEE, p. 322–326, 1989.*

Japanese Laid–open Patent Publication No. hei 4–243099 (published Aug. 31, 1992) including Patent Abstract of Japan JP4243099.

Korean Laid–open Patent Publication No. 93–18592 (published Sep. 22, 1993) including Patent Abstract.

* cited by examiner

*Primary Examiner*—Christine T. Tu
*Assistant Examiner*—Shelly A. Chase
(74) *Attorney, Agent, or Firm*—Harness, Dickey & Pierce, P.L.C.

(57) ABSTRACT

A merged data line test circuit classifies a plurality of data lines for merged and separated testing. In the merged data line test circuit, a control signal generator simultaneously asserts first and second control signals in response to a merged-test signal and alternately asserts the first and second control signals in response to a separated-test signal. A first comparison unit compares the data lines in a first data line group in response to the first control signal. A second comparison unit compares the data lines in a second data line group in response to the control second signal. A driver outputs merged data signals according to the outputs of the first and second comparison units. An external test circuit can examine the output merged data signals to detect a defect and generate the merged-test signal and the separated-test signal in a manner that identifies the location of a defective memory cell. Preferably, the separated-test signal is set so that the first and second signals are alternately activated.

17 Claims, 6 Drawing Sheets

MERGED DATA LINE TEST CIRCUIT FOR CLASSIFYING AND TESTING A PLURALITY OF DATA LINES, AND TEST METHOD PERFORMED BY THE SAME

BACKGROUND OF THE INVENTION

1. Field of the Invention

The present invention relates to a semiconductor memory device, a merged data line test circuit for combining a plurality of data lines and testing the merged data lines, and a test method performed with the test circuit.

2. Description of the Related Art

After manufacture of a semiconductor memory device such as a DRAM, a test certifies the memory cells of the device by testing writing, reading, or other operations of the device. With an increase in the memory capacity of a DRAM, the time required for this testing also increases. For example, in a 64 Mbit synchronous DRAM, a simple test procedure in which a data value of "0" or "1" is written to all memory cells and then read from every memory cell, requires about 24 seconds (or $90 \times 10^{-9}$ s$\times 4 \times 64 \times (1024)^2$) when 90 ns is the period of the clock signal for the synhronous DRAM. When several millions of DRAMs are produced each month, the time required for testing the DRAMs is significant. This test time raises the testing costs and degrades productivity. Thus, methods for reducing the test time are sought.

A parallel bit test method, which can be performed by a merged data line test circuit, tests several memory cells at the same time to reduce the test time. The merged data line test circuit merges a plurality of data lines for comparing data and base on the comparison determines whether a set of memory cells are all good or contain a bad (or defective) memory cell. In synchronous DRAMs, which operate in synchronization with a clock signal, the merged data line test circuit tests data from multiple memory cell data during a single clock cycle. If the testing detects a defect, the circuit needs to ascertain which memory cell is defective for a possible repair operation using redundant memory cells. However, the conventional merged data line test circuit simultaneously tests memory cell data without classification, so that, when a defect is detected, identifying the defective memory cell is difficult.

Therefore, a merged data line test circuit, which can determine the position of a defective cell, is sought.

SUMMARY OF THE INVENTION

In accordance with an aspect of the present invention, a merged data line test circuit classifies and tests a plurality of data lines and can easily determine the position of a defective cell when a test detects a defect.

In one embodiment of the invention, a merged data line test circuit classifies a plurality of data lines into upper and lower data lines and simultaneously or separately tests the upper or lower data lines. The test circuit includes a control signal generator, a first comparison unit, a second comparison unit, and a driver. The control signal generator generates first and second control signals in response to a separated-test signal and a merged-test signal. The separated-test signal is for directing the data lines to be separated into upper and lower data lines and then tested, and the merged-test signal is for directing the combination test. The first comparison unit compares the data lines in the upper data line group in response to the first control signal, and the second comparison unit compares the data lines in the lower data line group in response to the second control signal. The driver outputs merged data signal according to the output signals of the first and second comparison units. Preferably, the separated test alternatively activates the first and second control signals. The signal generator simultaneously activates the first and second control signals in response to the merged test signal.

In accordance with another embodiment of the invention, a testing method includes: (a) activating both first and second control signals in response to a merged-test signal; (b) simultaneously comparing the data lines using first and second comparison units which respectively respond to the first and second control signals; (c) alternately activating the first and then second control signal in response to a separated-test signal; and (d) outputting merged data signals according to the output signals of the first and second comparison units.

In the merged data line test circuit and method according to the present invention, when a defect is detected as the result of simultaneously testing a plurality of data lines, the data lines are separated and re-tested. In this way, the positions of defective cells can be easily determined.

BRIEF DESCRIPTION OF THE DRAWINGS

The above features and advantage of the present invention will become more apparent by describing in detail an exemplary embodiment thereof with reference to the attached drawings in which.

Use of the same reference symbols in different figures indicates similar or identical items.

DESCRIPTION OF THE PREFERRED EMBODIMENT

Hereinafter, the present invention is described by explaining an exemplary embodiment of the present invention with reference to the attached drawings. The present specification uses, as an example, a synchronous semiconductor memory device, which operates in synchronization with a clock signal, to illustrate a testing method. The testing method determines whether a plurality of memory cells are good or bad by writing the same data in the plurality of memory cells and then reading data from the memory cells.

Figure 1:
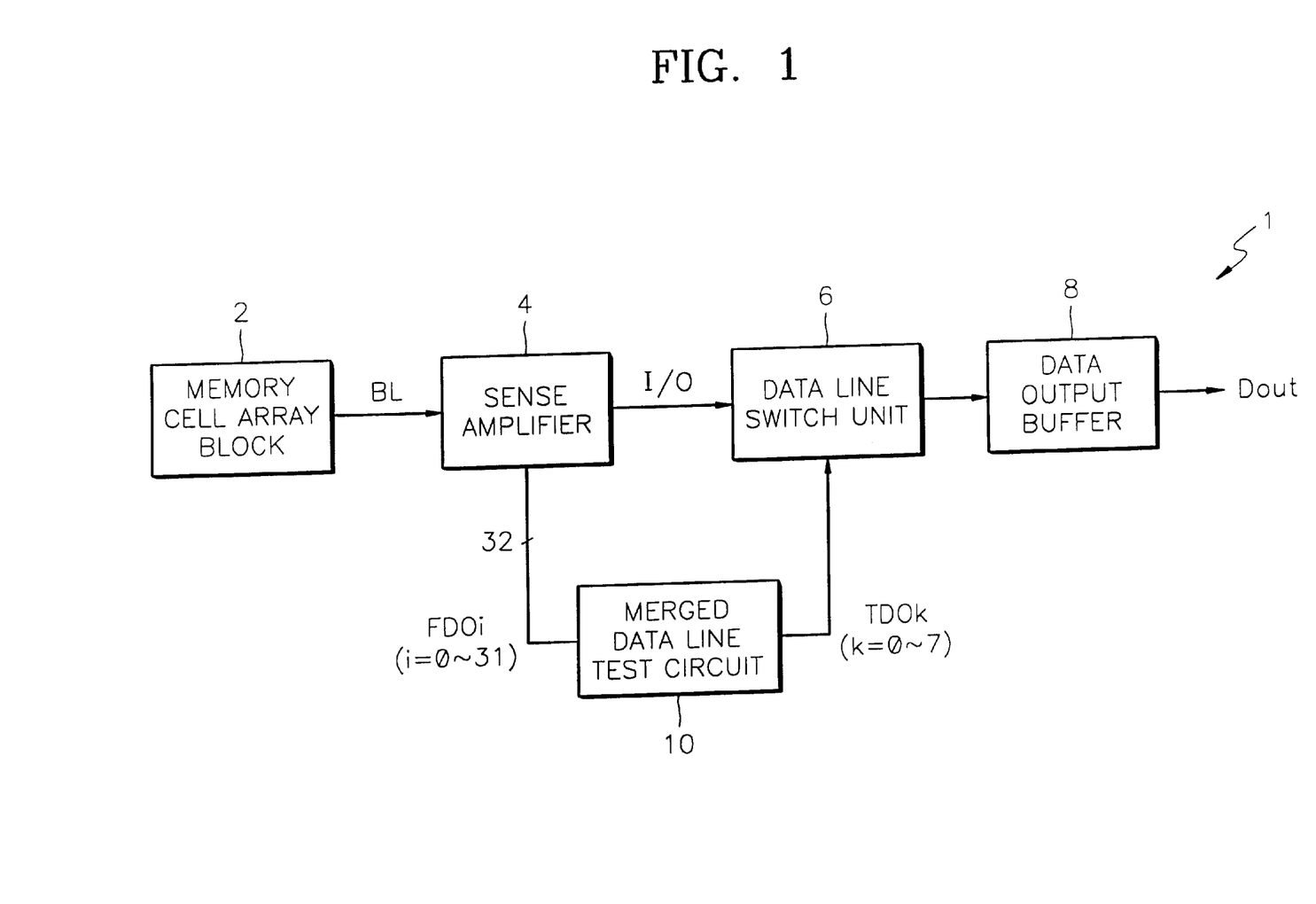
FIG. 1 is a block diagram illustrating a semiconductor memory device including a merged data line test circuit according to an embodiment of the present invention.

FIG. 1 is a block diagram of a synchronous semiconductor memory device 1 including a merged data line test circuit 10 according to an embodiment of the present invention. The synchronous semiconductor memory device 1 includes a memory cell array block 2, a sense amplifier 4, a data line switch unit 6, a data output buffer 8, and the merged data line test circuit 10.

The memory cell array block 2, which can be of a conventional design well-known in the art, includes a plurality of memory cells (not shown) which are arranged in rows and columns. The sense amplifier 4 sense-amplifies bit line (BL) signal changes representing data of cells selected from memory cells in the memory cell array block 2, and transmits a data signal on an I/O data line to the data line switch unit 6. The data line switch unit 6 determines whether to transmit the I/O data signals transmitted from the sense amplifier 4 or merged data signals TDOk (k=0 to 7) from the merged data line test circuit 10 to the data output buffer 8. The data output buffer 8 outputs data received from the data line switch unit 6, to output pads Dout. The merged data line test circuit 10 compares and simultaneously tests a plurality of data lines FDOi (i=0 to 31) in a merged test mode and generates the merged data TDOk (k=0 to 7).

Figure 2:
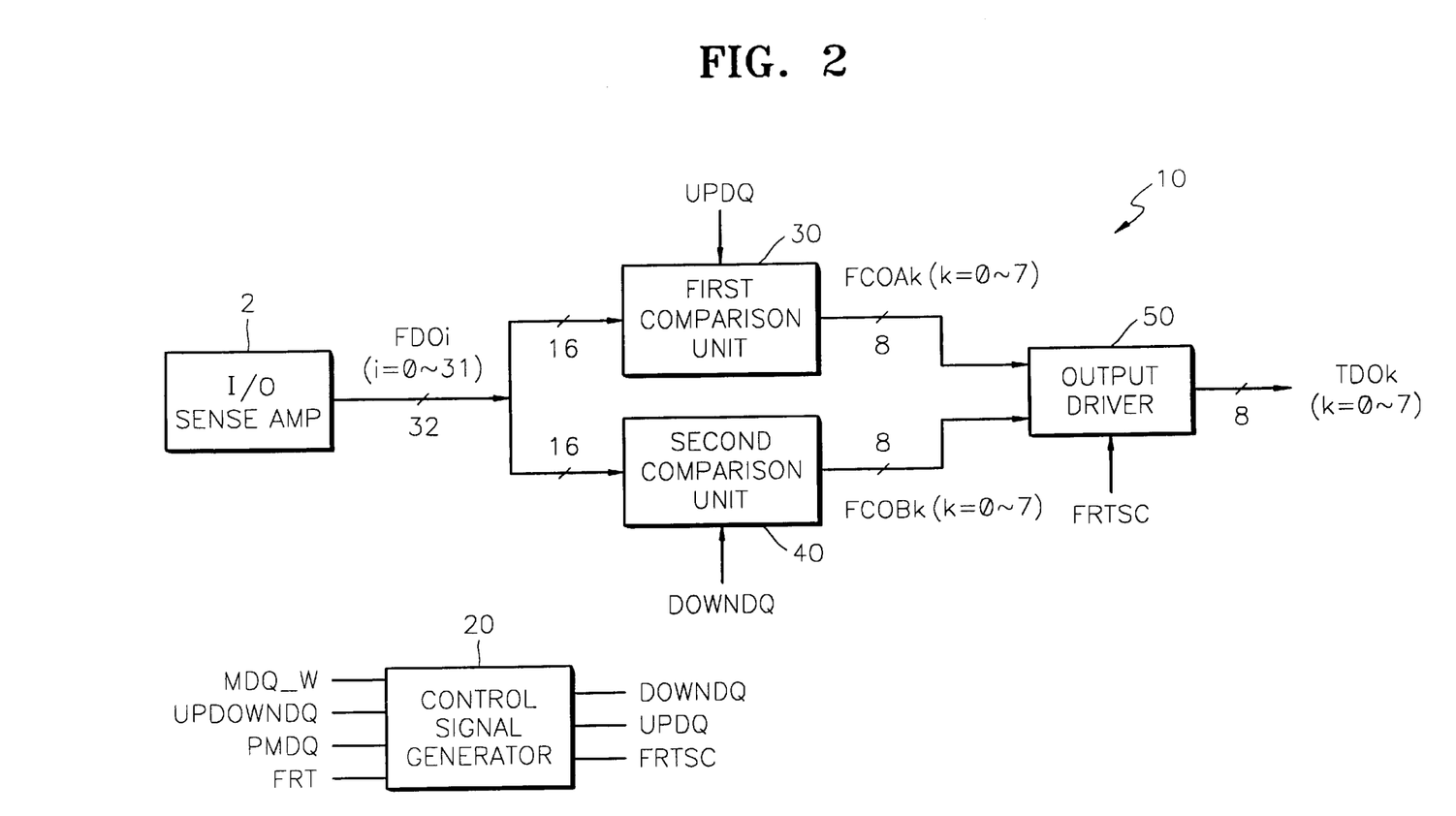
FIG. 2 is a block diagram illustrating the merged data line test circuit of FIG. 1.

FIG. 2 shows an embodiment of the merged data line test circuit 10, which merges and tests the plurality of data lines FDOi (i=0 to 31). The merged data line test circuit 10 classifies the data lines FDOi (i=0 to 31) into upper data lines and lower data lines. The merged data line test circuit 10 includes a control signal generator 20, first and second comparison units 30 and 40, and an output driver 50.

The control signal generator 20 generates a first control signal UPDQ and a second control signal DOWNDQ in response to a merged-test signal MDQ_W, a separated-test signal UPDOWNDQ, and a test enable signal PMDQ. The merged-test signal MDQ_W is for directing a merged testing operation of data lines FDOi (i=0 to 31). The separated-test signal UPDOWNDQ is for directing separation of the data lines FDOi (i=0 to 31) into upper data lines and lower data lines and testing the separated data line groups. The test enable signal PMDQ is for enabling or disabling testing.

Figure 3:
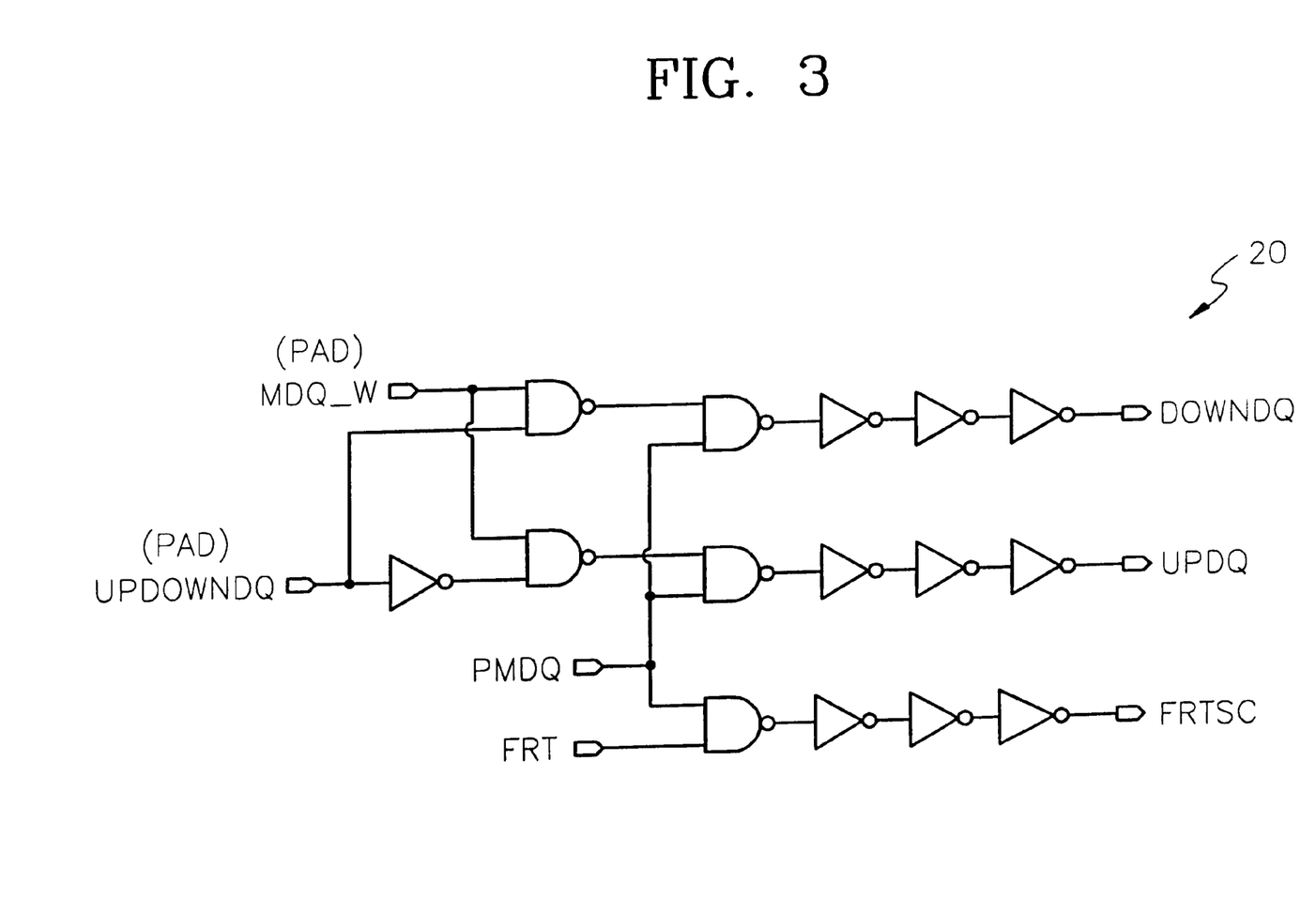
FIG. 3 is a circuit diagram illustrating the control signal generator of FIG. 2.

FIG. 3 shows an exemplary embodiment of the control signal generator 20. The test enable signal PMDQ must be at a logic high level to enable testing. Otherwise, all of the output signals DOWNDQ, UPDQ, and FRTSC of the control signal generator 20 are deactivate (at a logic low level). When testing is enabled, the control signal generator 20 simultaneously activates the first and second control signals UPDQ and DOWNDQ to the logic high level in response to the logic low level of the merged-test signal MDQ_W. The logic high levels of the first and second control signals UPDQ and DOWNDQ initiate the operation of the first and second comparison units 30 and 40, respectively, for simultaneous testing of data lines FDOi (i=0 to 31).

The control signal generator 20 generates the first control signal UPDQ at the logic high level and the second control signal DOWNDQ at the logic low level when the separated-test signal UPDOWNDQ is at the logic high level, while the merged-test signal MDQ_W and the test enable signal PMDQ are at the logic high level. The first control signal UPDQ when at the logic high level activates the first comparison unit 30, and the second control signal DOWNDQ when at the logic low level blocks operation of the second comparison unit 40.

On the other hand, the control signal generator 20 generates the first control signal UPDQ at the logic low level and the second control signal DOWNDQ at the logic high level when the separated-test signal UPDOWNDQ is at the logic low level, while the merged-test signal MDQ_W and the test enable signal PMDQ are at the logic high level. The first control signal UPDQ when at the logic low level blocks the operation of the first comparison unit 30, and the second control signal DOWNDQ when at the logic high level activates the second comparison unit 40.

The control signal generator 20 also generates an output driver enable signal FRTSC for the output driver 50 described below, in response to an internal clock signal FRT which is synchronized with an external clock signal (not shown) while the test-enable signal PMDQ is at the logic high level.

Figure 4:
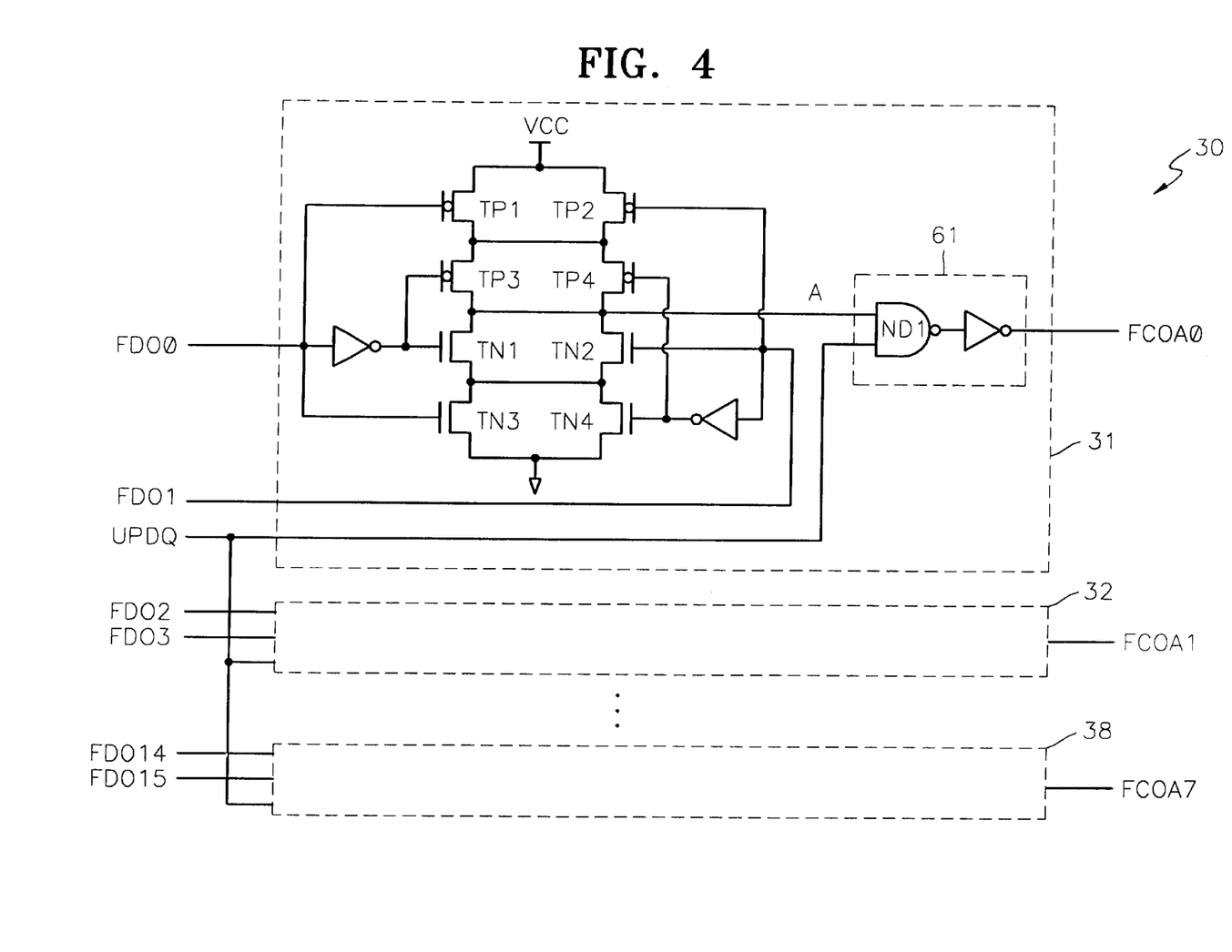
FIG. 4 is a circuit diagram illustrating the first comparison unit of FIG. 2.

FIG. 4 illustrates an embodiment of the first comparison unit 30 of FIG. 2. The first comparison unit 30 compares pairs of data lines from among the data lines FDOj (j=0 to 15) and generates upper compared data signals FCOAk (k=0 to 7) in response to the first control signal UPDQ being high. In alternative embodiments, the total number of data lines FDOi (i=0 to 31) provided from the sense amplifier 4 can vary, and the present specification describes an embodiment having 32 data lines FDOi (i=0 to 31) as an example. Data lines FDOi (i=0 to 31) are classified into two data line groups, that is, upper data lines FDOj (j=0 to 15) and lower data lines FDOj' (j'=16 to 31), according to the positions of memory cells connected to the data lines FDOi (i=0 to 31). Thus, the upper data lines FDOj (j=0 to 15) connect to the first comparison unit 30. The first comparison unit 30 compares pairs of data lines of the upper data lines FDOj (j=0 to 15) to each other and generates the upper compared data FCOAk (k=0 to 7) as the results of the comparisons.

The first comparison unit 30 includes eight comparators 31 through 38. The first comparator 31 compares signals on first and second upper data lines FDO0 and FDO1 to each other. If the first upper data line FDO0 and the second upper data line FDO1 carry the same data value, the voltage on an output node A drops to the logic low level. More specifically, if both data lines FDO0 and FDO1 are at the logic high level, PMOS transistors TP1 and TP2 turn off, and NMOS transistors TN2 and TN3 connect the node A to a ground, so that the level of a node A becomes the logic low level. If the first upper data line FDO0 and the second upper data line FDO1 are both at the logic low level, PMOS transistors TP3 and TP4 turn off, and NMOS transistors TN1 and TN4 connect the node A to ground. AND logic 61, which includes a NAND gate ND1 and an inverter, generates signal FCOA0 at the same level as the voltage on the node A if the first control signal UPDQ is at the logic high level. Otherwise, signal FCOA0 remains at the low level when the first control signal UPDQ is at the logic low level. Thus, when the first control signal UPDQ is asserted to the logic high level, the first upper compared data signal FCOA0 falls to the logic low level if the first and second upper data lines carry the same data value.

If the data line FDO0 is at the logic high level and the data line FDO1 is at the logic low level, the NMOS transistors TN1 and TN2 turn off, and the PMOS transistors TP2 and TP3 turn on to connect the node A to a power supply voltage (VCC). Accordingly, the node A rises to the logic high level. If the data line FDO0 is at the logic low level, and the data line FDO1 is at the logic high level, the NMOS transistors TN3 and TN4 turn off, and the PMOS transistors TP1 and TP4 turn on to connect the node A to the power supply voltage (VCC). The AND logic 61 asserts the upper compared data FCOA0 to the logic high level if the first control signal UPDQ is at the logic high level and the data lines FDO0 and FDO1 carry different data values.

When the first control signal UPDQ is at a logic low level, the first comparator 31 keeps the upper compared data signal FCOA0 at the logic low level regardless of values on the first and second data lines FDO0 and FDO1.

The other comparators 32 through 38 are structurally the same as the comparator 31 and generate respective compared data signals FCOA1 through FCOA7 according to the data values on the respective pairs of data lines. If the compared data signal FCOA0 through FCOA7 are at the logic low level when the first control signal UPDQ is activated, none of the memory cells connected to the upper data lines FDOj (=0 to 15) are defective. As described below, the output driver 50 can use the compared data signals FCOA0 through FCOA7 in the generation of output signals indicating whether a defect is in a memory cell connected to the upper data lines or the lower data lines.

Figure 5:
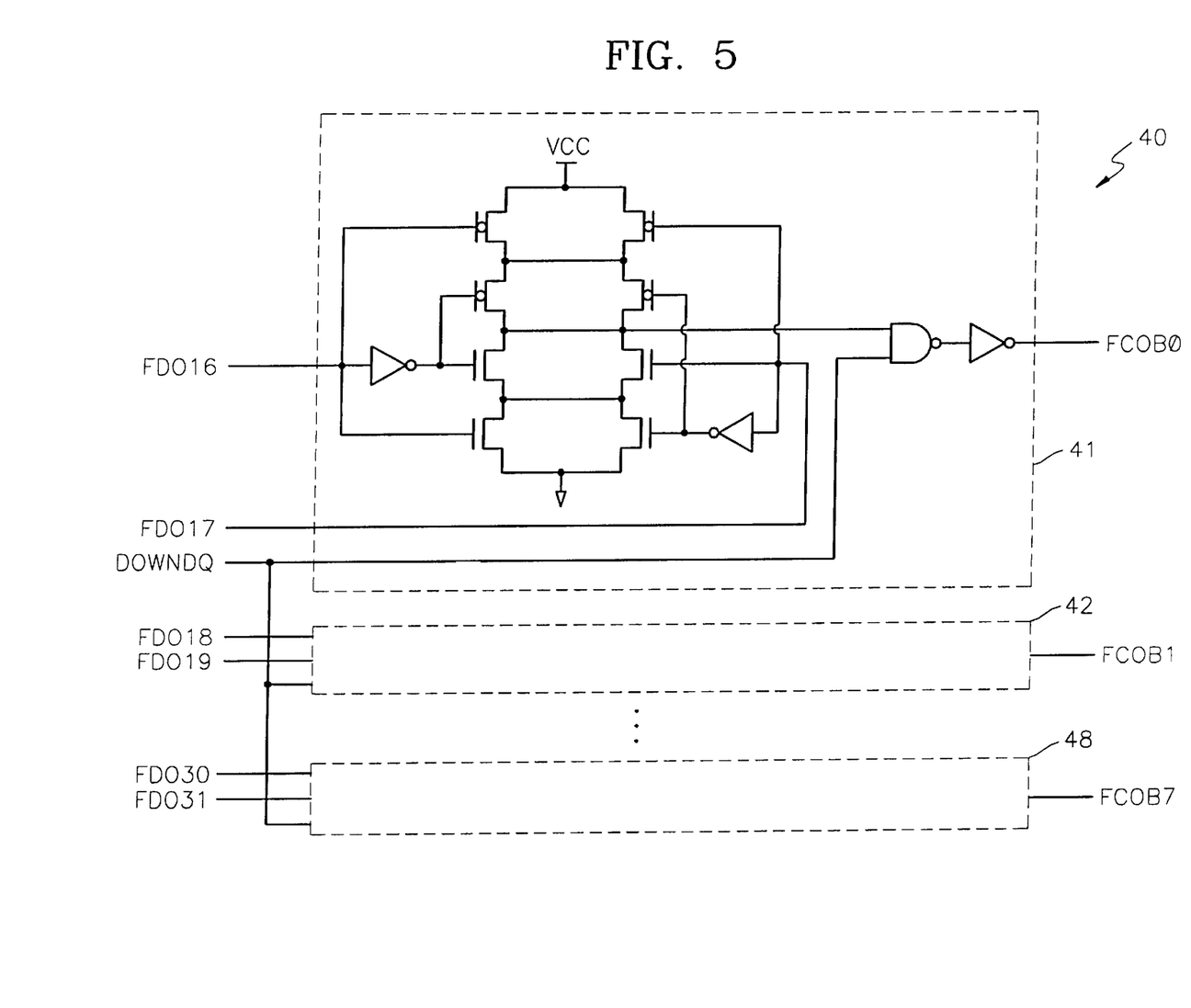
FIG. 5 is a circuit diagram illustrating the second comparison unit of FIG. 2.

FIG. 5 illustrates an embodiment of the second comparison unit 40 of FIG. 2. The second comparison unit 40 is structurally the same as the first comparison unit 30 of FIG. 4 described above, except that the second comparison unit 40 responds to the control signal DOWNDQ and compares pairs of the lower data lines FDOj' (j'=16 to 32). The second comparison unit 40 compares pairs of data lines of the lower data lines FDOj' (j'=16 to 31) and generates lower compared data FCOBk (k=0 to 7) in response to the control signal DOWNDQ having the logic high level. The lower compared data signals FCOBk (k=0 to 7) are at the logic low level regardless of the comparisons of the lower data lines FDOj' (j'=16 to 31) if the control signal DOWNDQ has the logic low level. The lower compared data signals FCOB0 through FCOB7 being at the logic low level when the control signal DOWNDQ is activated represents that the memory cells connected to the lower data lines FDOj' (j'=16 to 31) are not defective.

Figure 6:
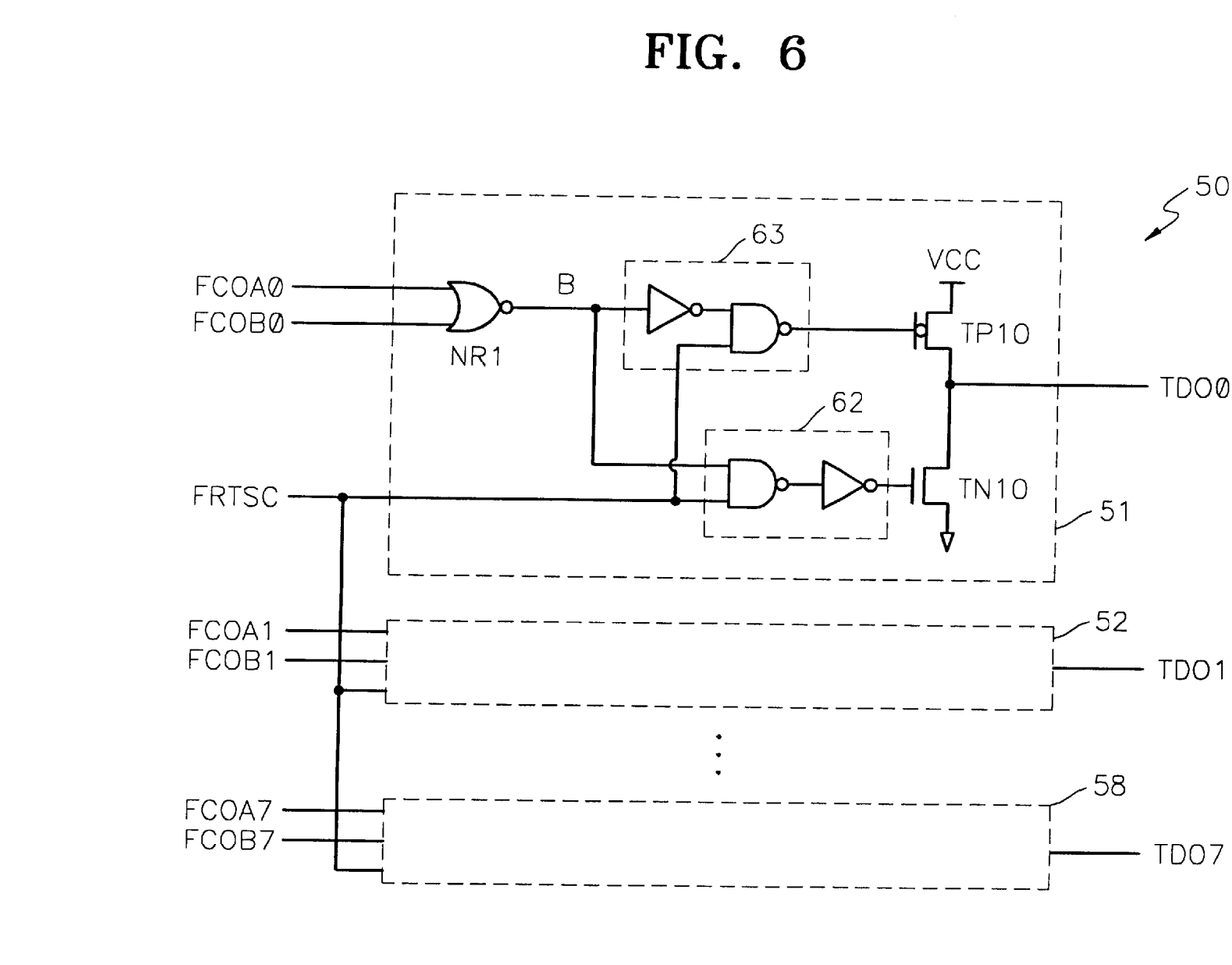
FIG. 6 is a circuit diagram illustrating the output driver of FIG. 2.

FIG. 6 shows an embodiment of the output driver 50 of FIG. 2. The output driver 50 combines the upper compared data FCOAk (k=0 to 7) with the lower compared data FCOBk (k=0 to 7) and generates the merged data signals TDOk (k=0 to 7) in response to the output driver enable signal FRTSC. The operation of the output driver 50 is described below using a first output driver 51 as an example.

In the first output driver 51, a node B, which is the output of a 2-input NOR gate NR1, rises to a logic high level when the first upper compared data signal FCOA0 and the lower compared data signal FCOB0 are at the logic low level. AND logic 62, which includes a NAND gate and an inverter in FIG. 6, turns on an NMOS transistor TN10 in response to a logic high level at the node B when the output driver enable signal FRTSC is at the logic high level. The transistor TN10, when on, pulls the merged data signal TDO0 to the logic low level. The logic low merged TDO0 represents that none of the memory cells associated with the upper compared data signal FCOA0 or the lower compared data signal FCOB0 are defective.

The node B drops to the logic low level when the upper compared data FCOA0 or the lower compared data FCOB0 is at the logic high level. In either case, the node B is at the logic high level which causes logic 63 to turn on the PMOS transistor TP10 if the output driver enable signal FRTSC is at the logic high level. When on, the PMOS transistor TP10 drives the merged data signal TDO0 to the logic high level. The logic high merged data signal TDO0 indicates the detection of a defect in a memory cell connected to a data line associated with the upper compared data signal FCOA0 and/or the lower compared data signal FCOB0. To identify the defective memory cell, the control signal DOWNDQ or UPDQ can be dropped to the logic low level. For example, dropping the control signal DOWNDQ to the logic low level forces the signal FCOA0 to the logic low level, and if the signal TDO0 remains at the logic high level, a defective memory cell is coupled to a data line associated with the signal FCOB0. If the signal TDO0 remains at the logic high level when the signal DOWNDQ drops to the logic low level, a defective memory cell is coupled to a data line associated with the signal FCOA0.

The merged data signal TDO0 from the first output driver 51 is at the logic high level when both the upper compared data FCOA0 and the lower compared data FCOB0 have the logic high level. This occurs when there are defective memory cells connected to the data lines associated with both signals FCOA0 and FCOB0. In this case, the merged data signal TDO0 remains high after either control signal DOWNDQ or UPDQ drops to the logic low level. This situation can be identified by alternately dropping signals DOWNQ and UPDQ to the logic low level. If in both cases, the merged data signal TDO0 remains high, there are at least two defective memory cells, at least one coupled to an upper data line and at least one coupled to a lower data line.

Here, when one of the merged data signals TDOk is found at the logic high level, the control signal generator 20 alternately deactivates the control signals UPDQ and DOWNDQ to the logic low level to determine which memory cells are defective. When the first control signal UPDQ is at the logic low level, the merged data signals TDOk (k=0 to 7) being low indicate that the memory cells connected to the lower data lines FDOj' (j'=16 to 31) are not defective, and a memory cell connected to an upper data line FDOj (j=0 to 15) is defective. When the first control signal UPDQ is at a logic low level, a signal TDOk being high indicates that a memory cell connected to the lower data line FDOj' (j'=16 to 31) is defective. When the control signal DOWNDQ is at a logic low level, signals TDOk (k=0 to 7) being low indicate that the memory cells connected to the upper data lines FDOj (j=0 to 15) are not defective, and a memory cell connected to a lower data line is defective.

The merged data signals TDOk (k=0 to 7) are transmitted to the data output buffer 8 via the data line switch unit 6, and output to the output pad Dout. An external test circuit can examine the output merged data signals and identify the position of a detected defect.

A testing method performed by the merged data line test circuit 10 for testing a plurality of data lines FDOi (i=0 to 31) is described below with reference to FIG. 2.

In the first step, the control signal generator 20 activates both control signals UPDQ and DOWNDQ in response to the test enable signal PMDQ and a merged-test signal MDQ_W.

In the second step, the first and second comparison units 30 and 40 respond to the control signals UPDQ and DOWNDQ and simultaneously compare pairs of the data lines FDOi (i=0 to 31).

In the third step, the results of the comparisons in the second step are generated as merged data signals TDOk (k=0 to 7) via the output driver 50. If the merged data signals TDOk (k=0 to 7) indicate no defects, testing of the merged data line test circuit 10 is completed. If the merged data signals TDOk (k=0 to 7) indicate the presence of a defect, the fourth step is performed.

In the fourth step, the control signal generator 20 alternately activates the control signals UPDQ and DOWNDQ in response to the test enable signal PMDQ and the separated-test signal UPDOWNDQ for separating and testing the data lines FDOi (i=0 to 31). An external test circuit (not shown) can generate signals PMDQ and UPDOWNDQ in response to examination of the merged data signals TDOk (k=0 to 7) output from the output driver 50. Separately asserting the control signals UPDQ and then DOWNDQ causes the merged signals TDOk (k=0 to 7) to correspond to the upper compared data signals FCOAk (k=0 to 7) and then the lower compared data signals FCOBk (k=0 to 7).

In the last step, the external circuit examines the merged data signals TDOk (k=0 to 7) that output driver 50 provides when signals UPDQ and DOWNDQ are separately asserted. The external circuit can then identify the position of the defective memory cell according to the outputs of the first and second comparison units, that is, according to the upper compared data signals FCOAk (k=0 to 7) and the lower compared data signals FCOBk (k=0 to 7).

The merged data line test circuit and the testing method described above have the advantage of simultaneously testing a number of data lines that is large when compared to the number of output signals. The exemplary embodiment, for example, simultaneously tests 32 data lines FDOi while the output driver outputs only eight merged data signals TDOk. The parallel testing of so many data lines reduces the test time reduces testing without requiring a large number of I/O pads for the testing. Additionally, when the plurality of data lines are simultaneously tested and a defect is detected, the data lines are classified into upper and lower data lines by a separated-test signal and then tested again, thereby allowing easy identification of the position of a defective cell.

Although the invention has been described with reference to a particular embodiment, modifications of the described embodiment may be made without departing from the spirit and scope of the invention. For example, in the exemplary embodiment of the merged data line test circuit, 32 data lines are classified into 16 upper data lines and 16 lower data lines, 16 upper data lines are compared in pairs, and the results of single-stage comparison are output as compared data. However, when the number of data lines is increased, multistage comparisons such as two-stage or three-stage comparisons can provide compared data indicating the comparison of four or eight or more data lines, and the compared data at different stages distinguishes particular groups (e.g., halves, quarters, eighths, etc.) of data lines. Thus, when merged data signals indicate a defect, examination of the signals from the different stages indicates the location of the defect. In view of the many possible variations and embodiments of the invention, the attached claims indicate the protected scope of the present invention, which is not limited to the disclosed embodiments.

What is claimed is:

1. A merged data line test circuit for a memory including data lines, the circuit comprising:
   a control signal generator that generates first and second control signals in response to a separated-test signal, the separated test signal directing separate testing of one of upper and lower data lines, and a merged-test signal, the merged test signal directing combined testing of the upper and lower data lines;
   a first comparison unit that compares data lines from among the upper data lines in response to the first control signal;
   a second comparison unit that compares data lines from among the lower data lines in response to the second control signal; and
   a driver that outputs merged data signals, each merged data signal being a combination of an output signal of the first comparison unit and an output signal of the second comparison unit.

2. The merged data line test circuit of claim 1, wherein the separated-test signal is externally input and can be set to alternatively activate the first and second control signals.

3. The merged data line test circuit of claim 1, wherein the control signal generator simultaneously activates the first and second control signals in response to the merged-test signal directing simultaneous testing of the data lines.

4. The merged data line test circuit of claim 1, wherein:
   the first comparison unit compares data patterns on the upper data lines to each other when the first control signal is activated, and when the data patterns are not consistent with each other, the first comparison unit generates signals indicating that a memory cell connected to the upper data lines is defective; and
   the second comparison unit compares data patterns on the lower data lines to each other when the second control signal is activated, and when the data patterns are not consistent with each other, the second comparison unit generate signals indicating that a memory cell connected to the lower data lines is defective.

5. A testing method for testing a plurality of data lines, the method comprising:
   (a) activating both first and second control signals in response to a merged-test signal;
   (b) simultaneously comparing the plurality of data lines using first and second comparison units that respond to the first and second control signals respectively;
   (c) alternately activating the first and second control signals in response to a separated-test signal; and
   (d) outputting merged data signals derived from output signals of the first and second comparison units.

6. A testing method for testing a plurality of data lines, the method comprising:
   (a) activating both first and second control signals in response to a merged-test signal;
   (b) simultaneously comparing the plurality of data lines using first and second comparison units that respond to the first and second control signals respectively;
   (c) alternately activating the first and second control signals in response to a separated-test signal;
   (d) outputting merged data signals when the first and second control signals are both asserted, the merged data signals representing a logical combination of the results of the comparisons by the first and second comparison units;
   (e) outputting the merged data signals when only the first control signal is asserted and the merged data signals representing results of comparisons by the first comparison unit; and
   (f) outputting the merged data signals when only the second control signal is asserted and the merged data signals representing results of comparisons by the second comparison unit.

7. The method of claim 6, wherein (b) simultaneously comparing the plurality of data lines using first and second comparison units comprises comparing upper data lines of the plurality of data lines using the first comparison unit and comparing lower data lines of the plurality of data lines using the second comparison unit.

8. The method of claim 6, further comprising comparing either upper data lines of the plurality of data lines using the first comparison unit or comparing lower data lines of the plurality of data lines using the second comparison unit based upon whether the first control signal or the second control signal is activated in response to the separated-test signal.

9. The method of claim 6, further comprising externally generating the separated-test signal in response to merged data signals indicating a detected defect, the separated-test signal causing alternate activation of the first and second signals.

10. The method of claim 5, further comprising externally generating the separated-test signal in response to merged data signals indicating a detected defect, the separated-test signal causing alternate activation of the first and second signals.

11. The method of claim 5, wherein (b) simultaneously comparing the plurality of data lines using first and second comparison units comprises comparing upper data lines of the plurality of data lines using the first comparison unit and comparing lower data lines of the plurality of data lines using the second comparison unit.

12. The method of claim 5, further comprising comparing either upper data lines of the plurality of data lines using the first comparison unit or comparing lower data lines of the plurality of data lines using the second comparison unit based upon whether the first control signal or the second control signal is activated in response to the separated-test signal.

13. A method for testing a plurality of data lines, the method comprising:

(a) activating either or both first and second control signals;

(b) reading data from either or both upper data lines and lower data lines of the plurality of data lines based upon whether either or both the first and second control signals are activated;

(c) comparing data from either or both upper data lines and lower data lines based upon whether either both the upper data lines and the lower data lines have been read; and (d) outputting merged data signals corresponding to comparisons from either or both upper data lines and lower data lines based upon whether a comparison was made on the upper data lines, the lower data lines, or both.

14. The method of claim 13, wherein (c) comparing data from either or both upper data lines and lower data lines comprises comparing data from the upper data lines in a first comparison unit and comparing data from the lower data lines in a second comparison unit.

15. The method of claim 13, wherein the first control signal or the second control signal is issued in response to the merged data signals indicating a detected defect in upper data lines or the lower data lines.

16. The method of claim 13, wherein activating either or both first and second control signals comprises activating either or both first and second control signals in response to a separated-test signal that is externally input.

17. The method of claim 13, wherein (c) comparing data from either or both upper data lines and lower data lines based upon whether either or both the first and second control signals are activated comprises:

comparing the upper data lines in a first comparison unit and comparing the lower data lines in the second comparison unit in response to a merged-test signal; and comparing the upper data lines in a first comparison unit or comparing the lower data lines in the second comparison unit in response to a merged-test signal in response to a seperated-test signal.

* * * * *